United States Patent
Mojumder et al.

(10) Patent No.: US 9,318,564 B2
(45) Date of Patent: Apr. 19, 2016

(54) HIGH DENSITY STATIC RANDOM ACCESS MEMORY ARRAY HAVING ADVANCED METAL PATTERNING

(71) Applicant: QUALCOMM Incorporated, San Diego, CA (US)

(72) Inventors: Niladri Mojumder, San Diego, CA (US); Stanley Seungchul Song, San Diego, CA (US); Zhongze Wang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 16 days.

(21) Appl. No.: 14/281,710

(22) Filed: May 19, 2014

(65) Prior Publication Data

US 2015/0333131 A1    Nov. 19, 2015

(51) Int. Cl.
| | |
|---|---|
| *H01L 29/76* | (2006.01) |
| *H01L 29/40* | (2006.01) |
| *H01L 29/161* | (2006.01) |
| *H01L 27/02* | (2006.01) |
| *H01L 27/11* | (2006.01) |

(52) U.S. Cl.
CPC .......... *H01L 29/401* (2013.01); *H01L 27/0207* (2013.01); *H01L 27/1104* (2013.01); *H01L 29/161* (2013.01)

(58) Field of Classification Search
CPC ............ H01L 27/115; H01L 27/11521; H01L 27/11568; H01L 21/28273; H01L 29/66825
USPC ................................................ 257/314, 322
See application file for complete search history.

(56) References Cited

U.S. PATENT DOCUMENTS

| | | | |
|---|---|---|---|
| 6,787,469 B2 | 9/2004 | Houston et al. | |
| 7,879,727 B2 | 2/2011 | Postnikov et al. | |
| 7,927,782 B2 | 4/2011 | Aton | |
| 2009/0189227 A1 | 7/2009 | Miyashita | |
| 2012/0280324 A1* | 11/2012 | Xiong .................. | H01L 27/1104 257/368 |
| 2013/0069168 A1 | 3/2013 | Blatchford | |
| 2013/0196517 A1 | 8/2013 | Tsujita et al. | |
| 2013/0258759 A1 | 10/2013 | Liaw | |
| 2014/0077380 A1 | 3/2014 | Kim et al. | |
| 2015/0179232 A1* | 6/2015 | Felix ...................... | G11C 5/145 365/154 |

OTHER PUBLICATIONS

International Search Report and Written Opinion—PCT/US2015/026588—ISA/EPO—Jul. 13, 2015.

\* cited by examiner

*Primary Examiner* — Quoc Hoang

(74) *Attorney, Agent, or Firm* — Muncy, Geissler, Olds & Lowe, P.C.

(57) ABSTRACT

Methods and apparatus directed toward a high density static random access memory (SRAM) array having advanced metal patterning are provided. In an example, provided is a method for fabricating an SRAM. The method includes forming, using a self-aligning double patterning (SADP) technique, a plurality of substantially parallel first metal lines oriented in a first direction in a first layer. The method also includes etching the substantially parallel first metal lines, using a cut mask, in a second direction substantially perpendicular to the first direction, to separate the substantially parallel first metal lines into a plurality of islands having first respective sides that are aligned in the first direction and second respective sides that are aligned the second direction. The method also includes forming, in a second layer, a plurality of second metal lines oriented in the first direction.

4 Claims, 8 Drawing Sheets

| | Fin, PO | MD1, MP | V0, M1 | V1, M2 |
|---|---|---|---|---|
| Layout | (figure) | (figure) | (figure) | (figure) |
| Patterning | PO, LELE (or SADP) + cut | MD1 LELE MP LELE | V0, LELELE M1, LE(V)+cut+LE(V) Last LE for WL Cut pattern break @ Vss | V1, LELE M2, LELE (or SADP) |

| Layout | | | | |
|---|---|---|---|---|
| Fin, PO (305) | MD1, MP (310) | V0, M1 (315) | V1, M2 (320) | |
| Patterning | PO, LELE (or SADP) + cut | MD1 LELE MP LELE | V0, LELELE M1, LE(V)+cut+LE(V) Last LE for WL Continuous cut pattern | V1, LELE M2, LELE (or SADP) |

FIG. 3

| Layout | 505 Fin, PO (62n, 298n) | 510 MD1, MP (MD1_c1, MD1_c2, MP_c1, MP_c2) | 515 V0, M1 (WL, 124n, 69n, 40n; Min M1 area=40×69n(=2760nm2)) | 520 V1, M2 (30n, 20n, 50n, 50n; Vss, BL, Vdd, BL, Vss, BL, Vdd, BL, Vss) |
|---|---|---|---|---|
| Patterning | PO, LELE (or SADP) + cut | MD1 LELE MP LELE | V0, LELELE M1, LE(V)+cut+LE(V) Last LE for WL Cut pattern break @ Vss | V1, LELE M2, LELE (or SADP) |

FIG. 5

HIGH DENSITY STATIC RANDOM ACCESS MEMORY ARRAY HAVING ADVANCED METAL PATTERNING

FIELD OF DISCLOSURE

This disclosure relates generally to electronics, and more specifically, but not exclusively, to methods and apparatus directed toward a high density static random access memory array having advanced metal patterning.

BACKGROUND

Random Access Memory (RAM) is a ubiquitous component of modern digital architectures. RAM can be a standalone device or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information when power is removed. Non-volatile RAM can maintain memory contents even when power is removed. One type of volatile RAM is Static Random Access Memory (SRAM), which typically uses a bi-stable latching circuit as a memory bit cell.

Modern market forces affect SRAM design and production, and thus there is demand to reduce a physical size of new SRAM designs. To continue doubling the density of SRAM circuits (per Moore's Law) at and below a feature size of 14 nm using CMOS technology, SRAM layout needs to be optimized to allow higher density, higher yield, and lower production costs. Researchers are confronted to come up with cost-effective SRAM layout optimization both at the bit-cell and memory array level.

Conventional six-transistor (6T) SRAM designs, such as FIG. 1's 6T SRAM design 100 having a word line (WL) in a first metal layer and a bit line (BL) in a second metal layer, have staggered and mis-aligned metal islands. When the circuit feature size is 22 nm, the structures depicted in FIG. 1 must be fabricated separately and individually using a fabrication technique known as lithography-etch-lithography-etch (also known as LELE). However, to shrink the feature size smaller than 22 nm, requires triple patterning (i.e., LELELE) with an increased mask count to separately and individually fabricate the staggered and mis-aligned metal islands. The increased number of masks increases fabrication costs, reduces fabrication speed, increases mask count, and decreases fabrication yield.

Accordingly, there are long-felt industry needs for methods and apparatus that improve upon conventional methods and apparatus, including the improved methods and apparatus provided hereby.

SUMMARY

This summary provides a basic understanding of some aspects of the present teachings. This summary is not exhaustive in detail, and is neither intended to identify all critical features, nor intended to limit the scope of the claims.

Exemplary methods and apparatus for fabricating a static random access memory (SRAM) are disclosed. An exemplary method includes forming, using a self-aligning double patterning technique, a plurality of substantially parallel first metal lines oriented in a first direction in a first layer. The method also includes etching the substantially parallel first metal lines, using a cut mask, in a second direction substantially perpendicular to the first direction, to separate the substantially parallel first metal lines into a plurality of islands having first respective sides that are substantially aligned in the first direction and second respective sides that are substantially aligned the second direction. An island in the plurality of islands can be configured as one of a bit line, a positive power conductor, and a negative power conductor. The method also includes forming, in a second layer, a plurality of second metal lines oriented in the first direction, as well as forming a silicon-germanium p-type metal-oxide-silicon (PMOS) passgate transistor including a gate coupled to a second metal line in the plurality of second metal lines and a drain coupled to an island in the plurality of islands. A second metal line in the plurality of second metal lines can be configured as a word line. The SRAM can be integrated into at least one of a mobile device, a set top box, music player, video player, entertainment unit, navigation device, communications device, personal digital assistant, fixed location data unit, and a computer.

In a further example, provided is a non-transitory computer-readable medium, comprising lithographic device-executable instructions stored thereon configured to cause a lithographic device to execute at least a part of the aforementioned method.

In another example, provided is an apparatus. The apparatus includes an SRAM that includes a plurality of metal islands formed on a substrate and having first respective sides that are substantially aligned in a first direction and second respective sides that are substantially aligned in a second direction except for every third island. The SRAM also includes a plurality of metal lines in a second layer and oriented in the first direction, as well as a silicon-germanium PMOS passgate transistor including a gate coupled to a metal line in the plurality of second metal lines and a drain coupled to an island in the plurality of metal islands. At least a part of the apparatus can be integrated on a semiconductor die. The apparatus can include at least one of a base station and a mobile device, with which the SRAM is integrated. The apparatus can also include at least one of a mobile device, a base station, a terminal, a set top box, a music player, a video player, an entertainment unit, a navigation device, a communications device, a personal digital assistant, a fixed location data unit, and a computer, of which the SRAM is a constituent part.

Also disclosed is an exemplary method for fabricating an SRAM. The method includes a step for forming, using a self-aligning double patterning technique, a plurality of substantially parallel first metal lines oriented in a first direction in a first layer, as well as a step for etching the substantially parallel first metal lines, using a cut mask, in a second direction substantially perpendicular to the first direction, to separate the substantially parallel first metal lines into a plurality of islands having first respective sides that are substantially aligned in the first direction and second respective sides that are substantially aligned the second direction. An island in the plurality of islands can be configured as one of a bit line, a positive power conductor, and a negative power conductor. The method also includes a step for forming, in a second layer, a plurality of second metal lines oriented in the first direction, as well as a step for forming a silicon-germanium PMOS passgate transistor including a gate coupled to a second metal line in the plurality of second metal lines and a drain coupled to an island in the plurality of islands. A second metal line in the plurality of second metal lines can be configured as a word line. The method can also include a step for integrating the SRAM into at least one of a mobile device, a set top box, music player, video player, entertainment unit, navigation device, communications device, personal digital assistant, fixed location data unit, and a computer.

Also disclosed is a method for reading a six-transistor static read only memory bit cell. The method includes pre-discharging a bit line and holding a word line at a logic low to turn on a high-channel mobility silicon-germanium PMOS passgate transistor, thus causing a read current to flow from the bit line, through the passgate transistor and a PMOS pull-up transistor (in a four-transistor bi-stable latching circuit) to a power supply.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

FIG. 3 depicts an exemplary method for fabricating a high density static random access memory bit cell having advanced metal patterning.

FIG. 5 also depicts an exemplary method for fabricating a high density static random access memory bit cell having advanced metal patterning.

Figure 1:
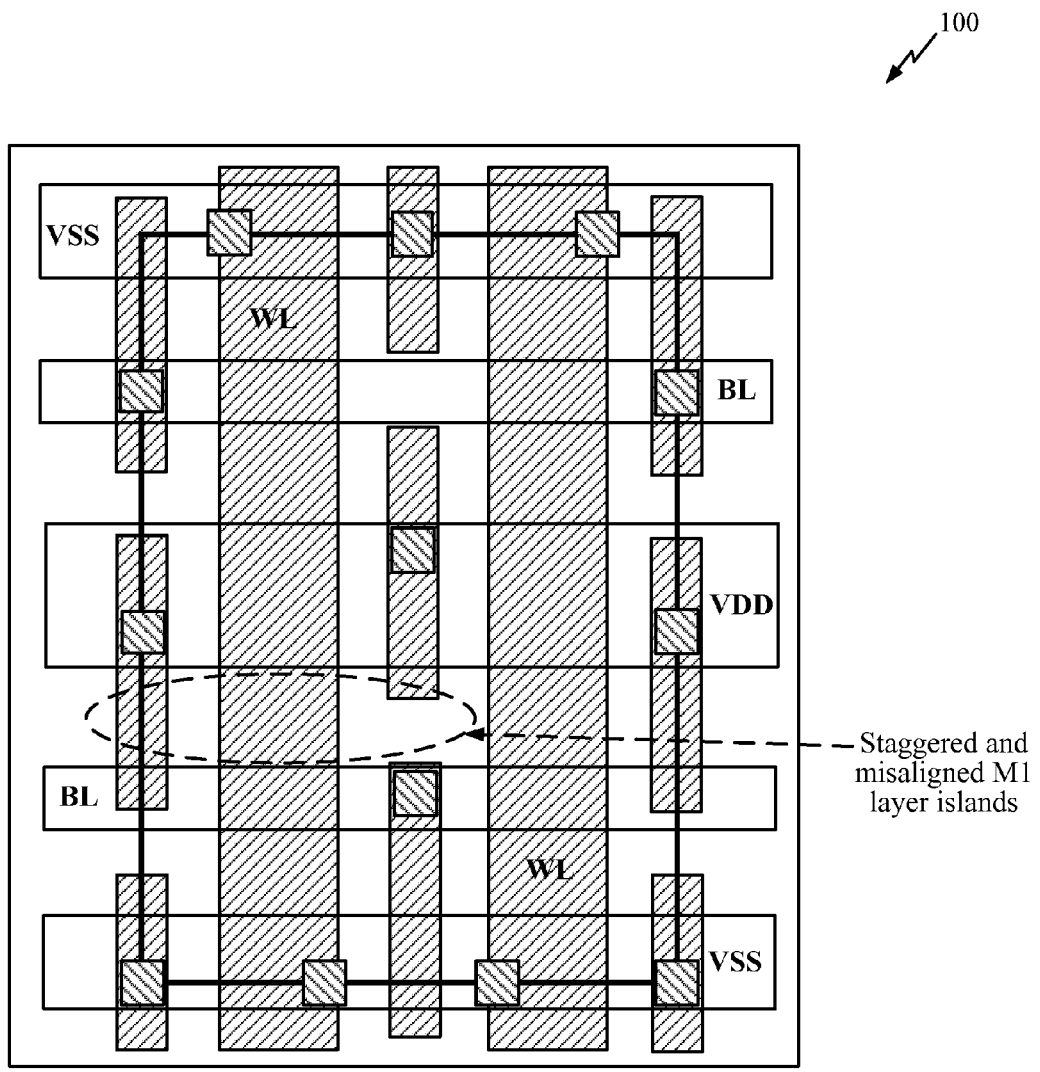
FIG. 1 depicts an exemplary conventional six-transistor static random access memory design.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

Methods and apparatus directed toward a high density static random access memory (SRAM) array having advanced metal patterning are provided. For example, provided is a new SRAM array layout including a vertical first metal layer and a single horizontal first metal layer cut to enable better process margin, reduced cost and simplified memory periphery design solutions. The proposed SRAM design allows one-directional (vertical) symmetric first metal layer patterning, thus reducing the effective number of masks.

In an example, provided is a method for fabricating a SRAM. The method includes forming, using a self-aligning double patterning (SADP) technique, a plurality of substantially parallel first metal lines oriented in a first direction in a first layer. The method also includes etching the substantially parallel first metal lines, using a cut mask, in a second direction substantially perpendicular to the first direction, to separate the substantially parallel first metal lines into a plurality of islands having first respective sides that are aligned in the first direction and second respective sides that are aligned the second direction. The method also includes forming, in a second layer, a plurality of second metal lines oriented in the first direction. An island in the plurality of islands can be configured as one of a bit line, a positive power conductor, and a negative power conductor. A second metal line in the plurality of second metal lines can be configured as a word line (WL). The WL and the plurality of islands are in first metal layer, but can be patterned sequentially with a specific set of orders.

The exemplary apparatuses and methods disclosed herein advantageously address the long-felt industry needs, as well as other previously unidentified needs, and mitigate shortcomings of the conventional methods and apparatus. For example, advantages provided by the disclosed apparatuses and methods herein include improvements in fabrication costs, fabrication speed, mask count, circuit density, and fabrication yield over conventional techniques. The provided apparatus are also scalable.

Exemplary embodiments are disclosed in this application's text and drawings. Alternate embodiments can be devised without departing from the scope of the invention. Additionally, conventional elements of the current teachings may not be described in detail, or may be omitted, to avoid obscuring aspects of the current teachings.

As used herein, the term "exemplary" means "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

The provided apparatuses can be a part of and/or coupled to, an electronic device having a memory, such as, but not limited to, at least one of a mobile device, a mobile telephone, a wireless device, a personal data assistant (PDA), a handheld computer, a portable computer, a GPS receiver, a navigation device, a camera, an audio player, a camcorder, a game console, a watch, a clock, a calculator, a television, a flat panel display, a computer monitor, an auto display (e.g., an odometer display, etc.), a cockpit control, a cockpit display, a display coupled to a camera (e.g., a rear and/or side view camera in a vehicle), an electronic photograph frame, an electronic billboard, an electronic sign, and a projector.

The term "mobile device" can describe, and is not limited to, a mobile phone, a mobile communication device, a pager, a personal digital assistant, a personal information manager, a mobile hand-held computer, a portable computer, a wireless device, a wireless modem, and/or other types of portable electronic devices typically carried by a person and having communication capabilities (e.g., wireless, cellular, infrared, short-range radio, etc.). Further, the terms "user equipment" (UE), "mobile terminal," "mobile device," and "wireless device" can be interchangeable.

Abbreviations

The following list of frequently-used abbreviations and acronyms are provided to assist in comprehending the current disclosure, and are not provided as limitations.

Figure 2:
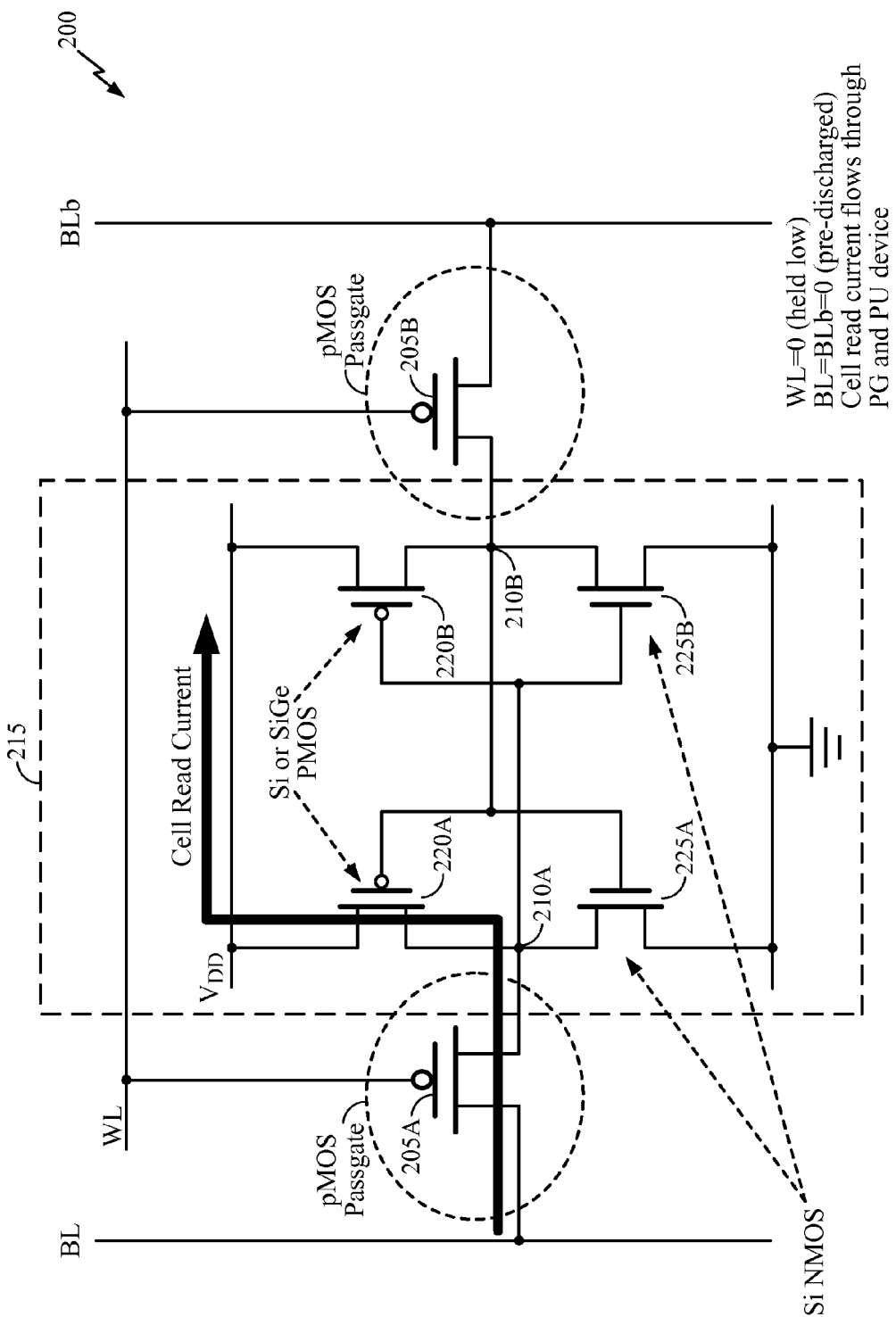
FIG. 2 depicts a schematic of an exemplary high-performance bit cell.

6T SRAM—six-transistor static random access memory
BL—bit line
BLb—bit line compliment
CUT—removing previously deposited material (e.g., by ablating, etching, and the like)
Ge—germanium
LE—lithography followed by etching
LELE—lithography followed by etching followed by second lithography followed by second etching
LELELE—lithography followed by etching followed by second lithography followed by second etching followed by third lithography followed by third etching.
M0, M1—metal layer number zero, metal layer number one, etc.
MD1—a first of two middle of line metal layer stacks below metal layer one.
MD2—a second of two middle of line metal layer stacks below metal layer one.
MP—middle of line metal contact for poly-silicon gate.
NMOS—n-type metal-oxide-semiconductor
PD—pull down
PG—passgate
PMOS—p-type metal-oxide-semiconductor
PO Polysilicon
PU—pull-up
SADP—self-aligned double patterning
Si—silicon
SL—source line
SRAM—static random access memory
UE—user equipment
V0, V1—vertical interconnect access (i.e., via) layer number
WL—word line Description of the Figures FIG. 2 depicts a schematic of an exemplary high-performance bit cell 200 that is an example of a high density static random access memory (SRAM) array having advanced metal patterning. The bit cell 200 includes two p-type metal-oxide-semiconductor (PMOS) transistors configured as passgates (PG) 205A-205B coupled to respective inputs 210A-210B of a bi-stable latching circuit 215. The two PMOS transistors configured as passgates 205A-205B can be fabricated of a material having higher channel mobility than silicon, such as silicon germanium (SiGe). The bistable latching circuit 215 includes a pair of complementary metal-oxide-semiconductor (CMOS) inverters made up of pull-up (PU) PMOS transistors 220A-220B coupled in series with respective pull-down (PD) n-type metal-oxide-semiconductor (NMOS) transistors 225A-225B. As depicted in FIG. 2, the gates and outputs of the PMOS transistors 220A-220B are cross-coupled with the respective NMOS transistors 225A-225B.

In operation, with power applied, a bit can be written to the high-performance bit cell 200, the high-performance bit cell 200 can retain the bit, and the bit can be read from the high-performance bit cell 200. When power is removed from the high-performance bit cell 200, the high-performance bit cell 200 no longer retains the bit. The passgates 205A-205B control access between bitlines (BL, BLb) and the bistable latching circuit 215 to control the writing, retaining and reading of a bit by the bistable latching circuit 215.

FIG. 2 also depicts performing a low-power read operation of the exemplary high-performance bit cell 200. The bit lines are pre-discharged at substantially zero volts. The word line (WL) is held low to turn on the passgates 205A-205B and allow current flow (i.e. access) between the bit lines and the bistable latching circuit 215. As a result, cell read current flows through one of the bitlines, one of the passgates 205A-205B, and one of the PU PMOS transistors 220A-220B to VDD (the PU PMOS transistor through which the cell read current flows depends on the state of the bistable latching circuit 215). This pulls-up the voltage on one of the bit lines to substantially VDD, while leaving the other bit line at substantially ground potential. A sense amplifier coupled to the bit lines can be used to determine which bitline has been pulled-up—thus identifying if the high-performance bit cell 200 stores logic "0" or logic "1."

FIG. 3 depicts an exemplary method 300 for fabricating a high density SRAM bit cell having advanced metal patterning, such as the exemplary high-performance bit cell 200. The depicted bit cells can be coupled to form an array of high density SRAM bit cells having advanced metal patterning.

In step 305, a polysilicon gate (PO) structure (e.g., the PG 205A-205B) is formed using lithography-etch-lithography-etch (LELE) or Self-Aligning Double Patterning (SADP) techniques and is then cut.

The SADP techniques can be used to form structures having a feature size at a critical dimension that is smaller (e.g., approximately two times smaller) than a critical dimension of a lithographic apparatus. The SADP techniques are particularly useful to fabricate parallel lines of material.

In an example, a SADP technique includes forming a spacer mask having a feature size that is two times smaller than the standard critical dimension of a lithographic apparatus. First, a layer of polysilicon material of which the structures are to be formed is deposited on a substrate. Then, a spacer mask is formed on this layer of material.

The spacer mask is formed using a first photolithographic deposition of sacrificial material with a template mask, at the standard critical dimension of the lithographic apparatus, followed by a first etching through a lithographic mask at the critical dimension of the lithographic apparatus. Then, a second photolithographic deposition of second material to form the spacer mask is performed, followed by a second etching to remove a particular depth of the second material. A third etching follows to remove the sacrificial material, which leaves the spacer mask formed of the second material not removed in the second etching. A fourth etching, through the spacer mask, of the previously disposed polysilicon material forms the structures having the feature size at the critical dimension that is smaller than the standard critical dimension of the lithographic apparatus. Thus, each line of the spacer mask produces two lines. The spacer mask can then be removed.

In step 310, MD1 and MP structures are formed using respective LELE techniques.

In step 315, via level zero (V0) structures are formed using a LELE or a lithography-etch-lithography-etch-lithography-etch (LELELE) technique. Further, metal level one (M1) structures are formed by forming first metal lines (depicted as the far left, center, and far right vertical lines) in a single direction using a LE technique, then the metal lines are cut (e.g., continuously) at substantially equal intervals using a cut mask. Thus, the first metal lines are cut in a direction substantially perpendicular to the direction of the first metal lines to separate the substantially parallel first metal lines into a plurality of islands having first respective sides that are aligned substantially in the direction of the first metal lines and second respective sides that are aligned substantially perpendicular to the first metal lines. This results in islands in the plurality of islands that are aligned, instead of staggered. After the cut, two metal lines configured as word lines (WL) are formed parallel with the first metal lines. See FIG. 4 for additional details.

In step 320, via level zero (V1) structures are formed using a LELE technique. Further, metal level two (M2) structures are formed by forming second metal lines in a single direction using LELE or SADP techniques. The second metal lines are configured as VSS and BL lines.

Figure 4:
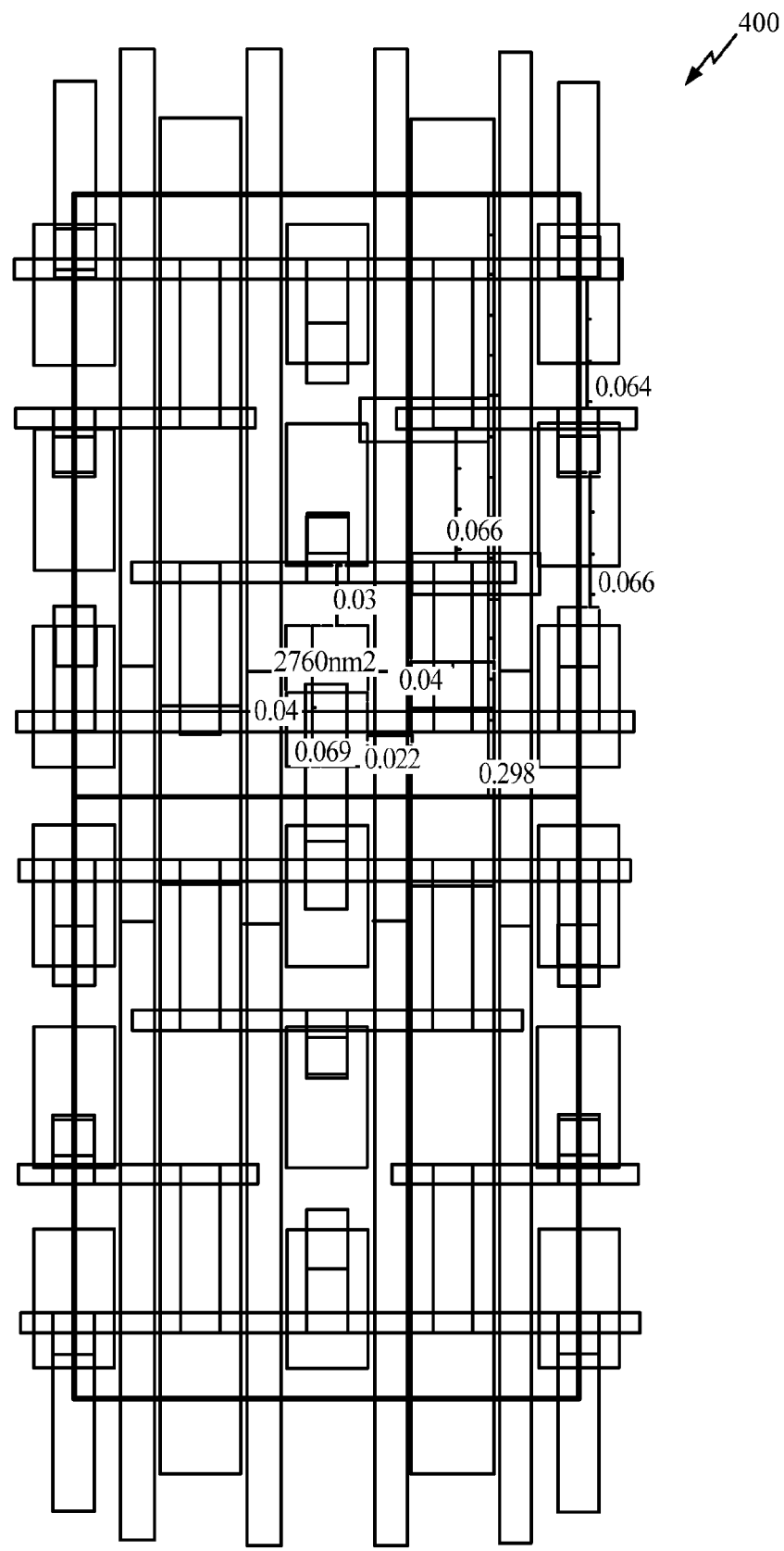
FIG. 4 depicts exemplary detail about fabrication of the metal one layer word line.

FIG. 4 depicts exemplary detail 400 about fabrication of the metal one layer (M1) word line (WL) in the exemplary method 300. Specifically, in an example, a VDD, BL, and/or VSS island formed during the cut technique in step 315 can be as large as 2760 nm^2 when the WL width is substantially at 40 nm (40 nm×69 nm=2760 nm^2). Thus, a larger than minimum allowed landing pad area can be provided with this design. Also, a minimum allowed landing pad area can also be provided with this design.

FIG. 5 also depicts an exemplary method 500 for fabricating a high density SRAM bit cell having advanced metal patterning, such as the exemplary high-performance bit cell 200. The depicted bit cells can be coupled to form an array of high density static random access memory bit cells having advanced metal patterning.

In step 505, a PO structure is formed using LELE or SADP techniques and is then cut.

In step 510, MD1 and MP structures are formed using respective LELE techniques.

In step 515, via level zero (V0) structures are formed using a LELELE technique. Further, metal level one (M1) structures are formed by forming first metal lines (depicted as the far left, center, and far right vertical lines) in a single direction using a LE technique, then the metal lines are cut at substantially equal intervals using a cut mask. In step 515, the cut can be continuous, except for except for an island configured as VSS (e.g., every third island). Not separating the VSS line into two separate islands allows for two adjacent VSS lines (e.g., as depicted in step 320) to be combined in to a single VSS line. This combination reduces bit line capacitance, which improves bit cell electrical performance. Further, the first metal lines are cut in a direction substantially perpendicular to the direction of the first metal lines to separate the substantially parallel first metal lines into a plurality of islands having first respective sides that are aligned substantially in the direction of the first metal lines and second respective sides that are aligned substantially perpendicular to the first metal lines (except for the island configured as VSS). This results in islands that are aligned, instead of staggered. After the cut, two metal lines configured as word lines (WL) are formed parallel with the first metal lines.

In step 520, via level zero (V1) structures (depicted as black boxes) are formed using a LELE technique. Further, metal level two (M2) structures are formed by forming second metal lines in a single direction using LELE or SADP techniques. The second metal lines are configured as VSS and BL lines.

Figure 6:
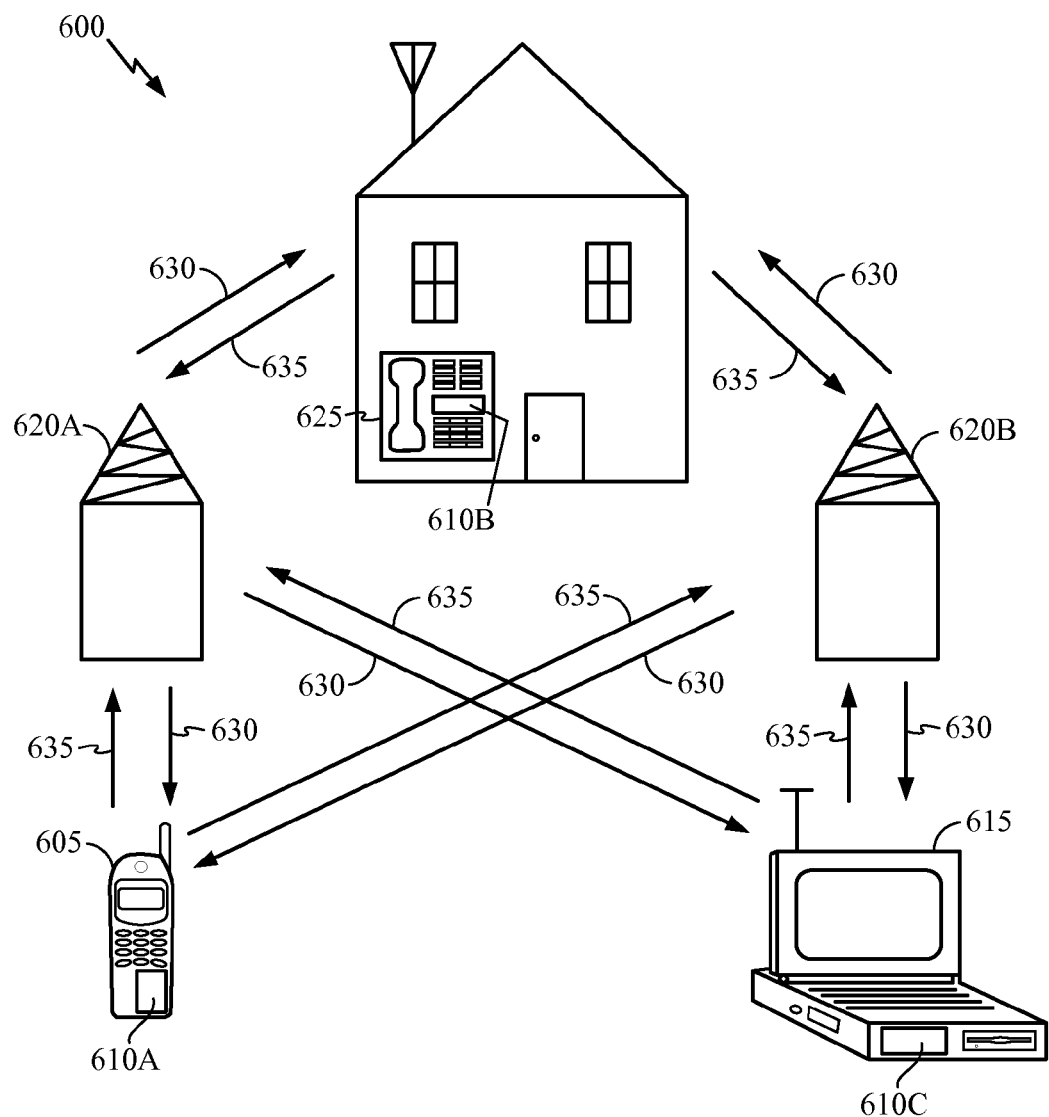
FIG. 6 depicts an exemplary communication system.

FIG. 6 depicts an exemplary communication system 600 in which an embodiment of the disclosure can be advantageously employed. For purposes of illustration, FIG. 6 shows three remote units 605, 615, and 625 and two base stations 620A-B. The communication system 600 can have more or fewer remote units and more or fewer base stations. The remote units 605, 615, and 625 include at least a part of an embodiment 610A-C of the disclosure as discussed further herein. FIG. 6 also shows forward link signals 630 from the base stations 620A-B and the remote units 605, 615, and 625, as well as reverse link signals 635 from the remote units 605, 615, and 625 to the base stations 620A-B.

In FIG. 6, the remote unit 605 is shown as a mobile telephone, the remote unit 615 is shown as a portable computer, and the remote unit 625 is shown as a fixed location remote unit in a wireless local loop system. In examples, the remote units 615 can be a mobile device, a mobile phone, a hand-held personal communication systems (PCS) unit, a portable data unit such as a personal data assistant, a GPS-enabled device, a navigation device, a set top box, a music player, a mobile device, a video player, an entertainment unit, or any other device that stores or retrieves data or computer instructions, or any combination thereof. Although FIG. 6 depicts remote units according to the teachings of the disclosure, the disclosure is not limited to these exemplary remote units. Embodiments of the disclosure can be suitably employed in any device which includes SRAM memory.

Figure 7:
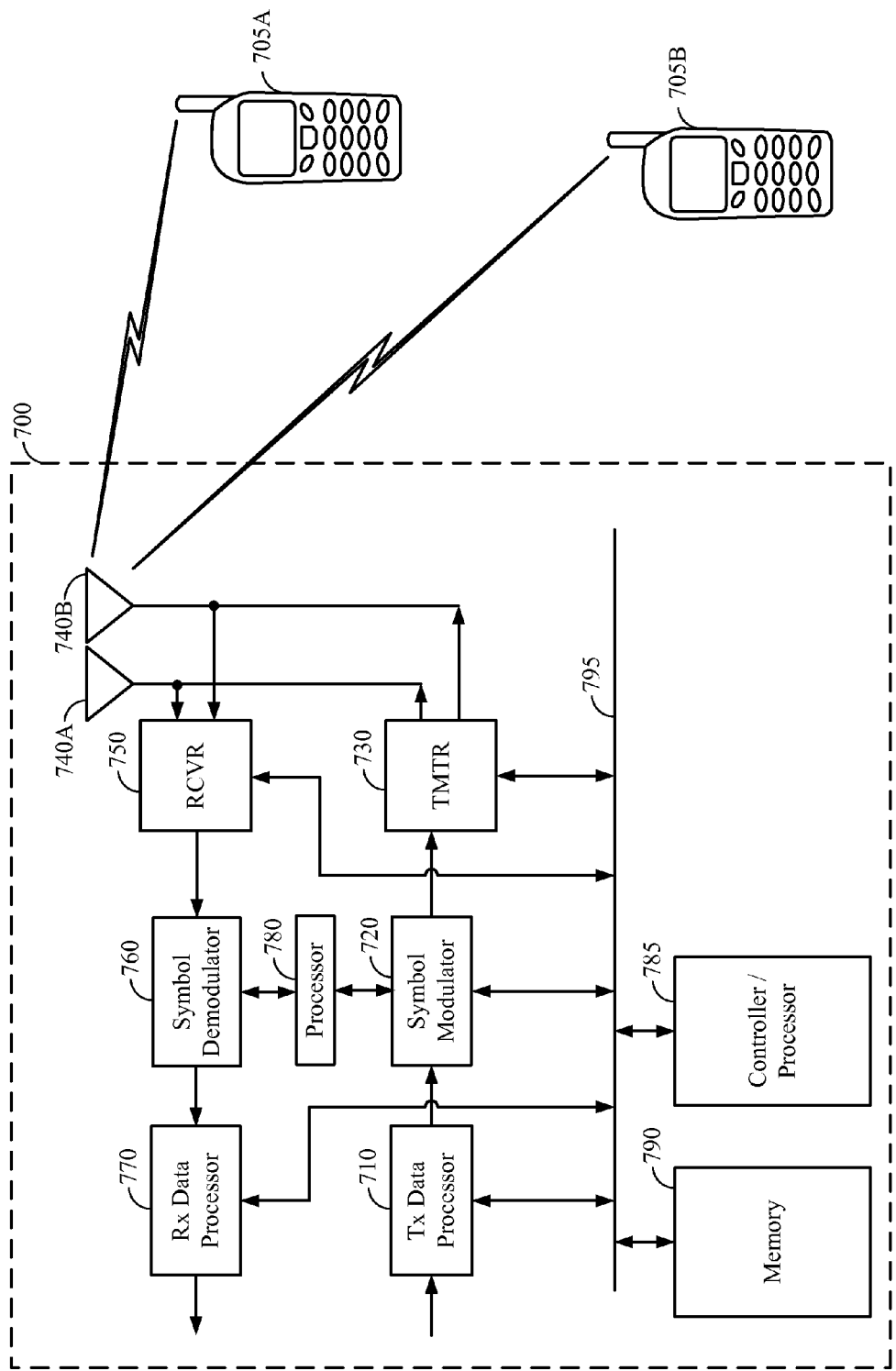
FIG. 7 depicts an exemplary access point.

FIG. 7 depicts an exemplary access point (AP) 700. The access point 700 can be, for example, any of the base stations 620A-B. As shown, the access point 700 includes a TX data processor 710, symbol modulator 720, transmitter unit (TMTR) 730, one or more antennas (e.g., antennas 740A-B), receiver unit (RCVR) 750, symbol demodulator 760, RX data processor 770, and configuration information processor 780, performing various operations to communicate with one or more mobile devices (e.g., user devices 705A-B). The access point 700 can also include one or more controllers and/or processors (illustrated in the singular as the controller/processor 785) and a memory 790 (e.g., the high-performance bit cell 200) configured to store related data or instructions. Together, via a bus 795, these units can perform processing in accordance with an appropriate radio technology or technologies used for communication, as well as other functions for the access point 700. The exemplary high-performance bit cell 200 can be a part of a circuit within, and/or coupled to, a portion of the access point 700, such as the TX data processor 710, the symbol modulator 720, the transmitter unit 730, the receiver unit 750, the symbol demodulator 760, the RX data processor 770, and/or the configuration information processor 780 and/or the controller/processor 785. In an example, any of the base stations 620A-B and/or the access point 700 is configured to perform at least a part of a method described hereby.

The access point 700 can provide a wireless local area network (WLAN) air interface (e.g., in accordance with an IEEE 802.11x protocol), and/or a cellular air interface (e.g., in accordance with an LTE protocol). The access point 700 can communicate with a user device (e.g., user devices 705A-B), and a user device (e.g., user devices 705A-B) can communicate with the access point 700. In general, the access point 700 can provide an air interface (e.g., in accordance with an IEEE 802.11x protocol) over an unlicensed portion of the wireless spectrum such as an industrial, scientific, and medical (ISM) radio band, and/or can provide an air interface (e.g., in accordance with an LTE protocol) over a licensed portion of the wireless band reserved for cellular communications. The access point 700 can also be configured to provide cellular (e.g., LTE) connectivity over an unlicensed portion of the wireless spectrum. This type of unlicensed cellular operation can include the use of an anchor licensed carrier operating in a licensed portion of the wireless spectrum (e.g., LTE Supplemental DownLink (SDL)) and an unlicensed portion of the wireless spectrum (e.g., LTE-Unlicensed), or can be a standalone configuration operating without using an anchor licensed carrier (e.g., LTE Standalone).

Figure 8:
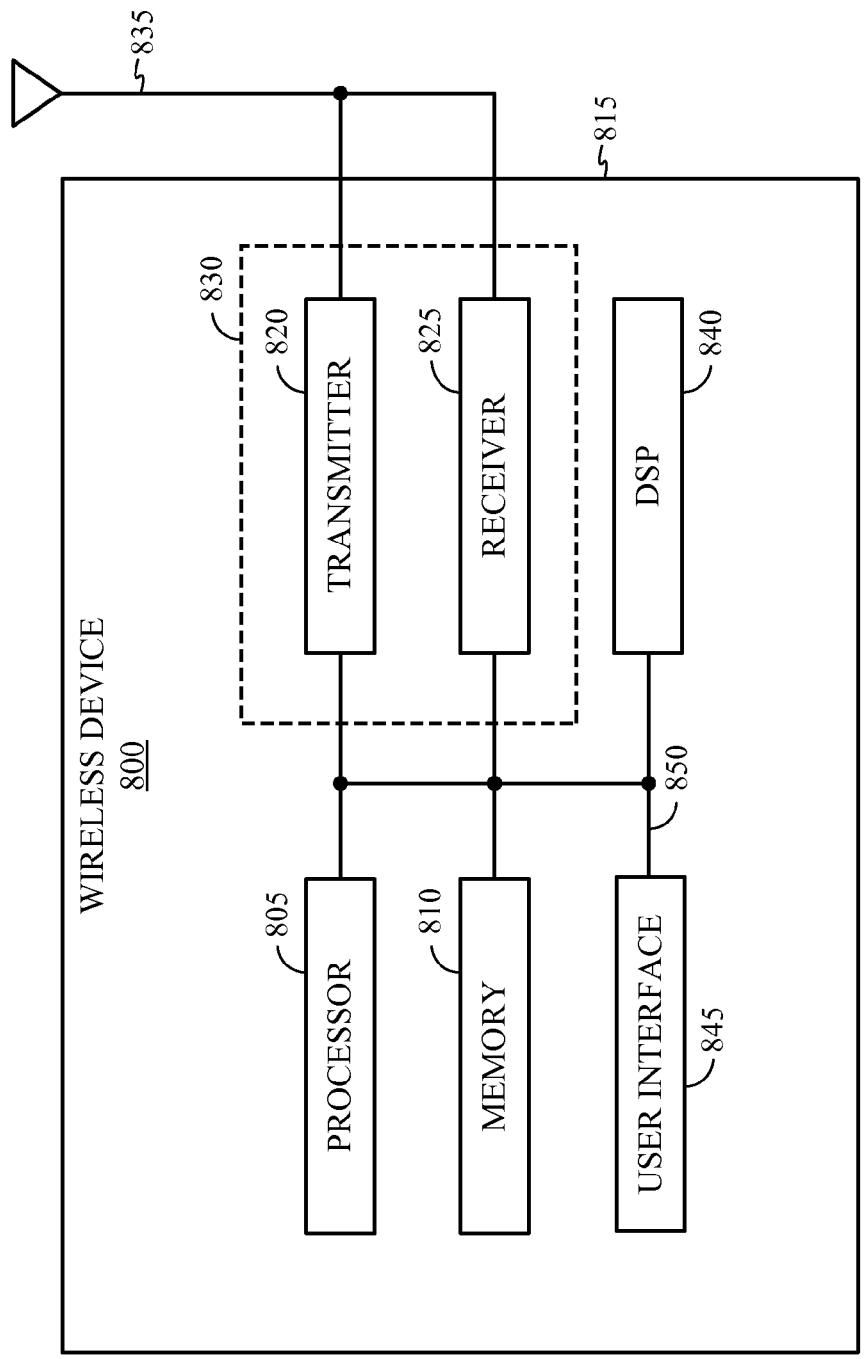
FIG. 8 depicts a functional block diagram of an exemplary wireless device.

FIG. 8 illustrates various components that can be utilized in a wireless device 800 (e.g., a mobile device) that can be employed within the communication system 600. The wireless device 800 is an example of a device that can be configured to include the apparatus described herein. The wireless device 800 can be, for example, any of three remote units 605, 615, and 625. The wireless device 800 can be a mobile device, such as a user device (e.g., user devices 705A-B).

The wireless device 800 can include a processor 805 which controls operation of the wireless device 800. The processor 805 can also be referred to as a central processing unit (CPU). A memory 810, which can include both read-only memory (ROM) and random access memory (RAM) (e.g., the high-performance bit cell 200), provides instructions and data to the processor 805. A portion of the memory 810 can also include non-volatile random access memory (NVRAM). The processor 805 performs logical and arithmetic operations based on program instructions stored within the memory 810. The instructions in the memory 810 can be executable to implement the methods described herein.

The processor 805 can comprise or be a component of a processing system implemented with one or more processors. The one or more processors can be implemented with a microprocessor, a microcontroller, a digital signal processor (DSP), a field programmable gate array (FPGA), a programmable logic device (PLD), a controller, a state machine, gated logic, a discrete hardware component, a dedicated hardware finite state machine, and/or any other suitable entity that can calculate and/or manipulate information.

The processing system can also include a non-transitory machine-readable media that stores software. Software can mean any type of instructions, whether referred to as software, firmware, middleware, microcode, hardware description language, and/or otherwise. Instructions can include code (e.g., in source code format, binary code format, executable code format, or any other suitable format of code). The instructions, when executed by the one or more processors, can transform the processor (e.g., the processor 805) into a special-purpose processor that causes the processor to perform a function described herein.

The wireless device 800 can also include a housing 815, a transmitter 820, and a receiver 825 to allow transmission and reception of data between the wireless device 800 and a remote location. The transmitter 820 and receiver 825 can be combined into a transceiver 830. An antenna 835 can be attached to the housing 815 and electrically coupled to the transceiver 830. The wireless device 800 can also include (not shown) multiple transmitters, multiple receivers, multiple transceivers, and/or multiple antennas.

The wireless device 800 can further comprise a digital signal processor (DSP) 840 that is configured to process data. The wireless device 800 can also further comprise a user interface 845. The user interface 845 can comprise a keypad, a microphone, a speaker, and/or a display. The user interface 845 can include any element and/or component that conveys information to a user of the wireless device 800 and/or receives input from the user.

The various components of the wireless device 800 can be coupled together by a bus system 850. The bus system 850 can include a data bus, for example, as well as a power bus, a control signal bus, and/or a status signal bus in addition to the data bus. Those of skill in the art will appreciate the components of the wireless device 800 can be coupled together to accept or provide inputs to each other using some other mechanism.

The exemplary high-performance bit cell 200 can be a part of a circuit within, and/or coupled to, a portion of the wireless device 800, such as the processor 805, the memory 810, the transmitter 820, the receiver 825, and/or the DSP 840. In an example, any of the base stations 620A-B and/or the wireless device 800 is configured to perform at least a part of a method described hereby.

Although a number of separate components are illustrated in FIG. 8, those having skill in the art will recognize that one or more of the components can be combined or commonly implemented. For example, the processor 805 can be used to implement not only the functionality described above with respect to the processor 805, but also to implement the functionality described above with respect to the DSP 840. Further, each of the components illustrated in FIG. 8 can be implemented using a plurality of separate elements.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO Re10, RevA, RevB) technology and other technologies. The techniques can be used in emerging and future networks and interfaces, including Long Term Evolution (LTE).

At least a portion of the methods, sequences, and/or algorithms described in connection with the embodiments disclosed herein can be embodied directly in hardware, in software executed by a processor, or in a combination of the two. In an example, a processor includes multiple discrete hardware components. A software module may reside in RAM memory, flash memory, ROM memory, EPROM memory, EEPROM memory, registers, hard disk, a removable disk, a CD-ROM, and/or any other form of storage medium known in the art. An exemplary storage medium (e.g., a memory) can be coupled to the processor such that the processor can read information from, and write information to, the storage medium. In an alternative, the storage medium may be integral with the processor.

Further, many embodiments are described in terms of sequences of actions to be performed by, for example, elements of a computing device. The actions described herein can be performed by a specific circuit (e.g., an application specific integrated circuit (ASIC)), by program instructions being executed by one or more processors, or by a combination of both. Additionally, a sequence of actions described herein can be considered to be embodied entirely within any form of computer readable storage medium having stored therein a corresponding set of computer instructions that upon execution would cause an associated processor (such as a special-purpose processor) to perform at least a portion of a function described herein. Thus, the various aspects of the invention may be embodied in a number of different forms, all of which have been contemplated to be within the scope of the claimed subject matter. In addition, for each of the embodiments described herein, a corresponding circuit of any such embodiments may be described herein as, for example, "logic configured to" perform a described action.

An embodiment of the invention can include a computer readable media embodying a method described herein. Accordingly, the invention is not limited to illustrated examples and any means for performing the functions described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a non-transitory (i.e., a non-transient) computer-readable media. The file can be provided to a fabrication handler who fabricates with a lithographic device, based on the file, an integrated device. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating. Etching of a material to form at least a portion of a structure described herein can be performed using etching techniques such as plasma etching. In an example, the integrated device is on a semiconductor wafer. The semiconductor wafer can be cut into a semiconductor die and packaged into a semiconductor chip. The semiconductor chip can be employed in a device described herein (e.g., a mobile device).

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. An apparatus, comprising:
  a static random access memory including:
    a plurality of metal islands formed on a substrate and having first respective sides that are substantially aligned in a first direction and second respective sides that are substantially aligned in a second direction except for every third island;

a plurality of metal lines in a second layer and oriented in the first direction; and a silicon-germanium p-type metal-oxide-silicon pass-gate transistor including a gate coupled to a metal line in the plurality of metal lines and a drain coupled to an island in the plurality of metal islands.

2. The apparatus of claim 1, wherein at least a part of the apparatus is integrated on a semiconductor die.

3. The apparatus of claim 1, further comprising at least one of a base station and a mobile device, with which the static random access memory is integrated.

4. The apparatus of claim 1, further comprising at least one of a mobile device, a base station, a terminal, a set top box, a music player, a video player, an entertainment unit, a navigation device, a communications device, a personal digital assistant, a fixed location data unit, and a computer, of which the static random access memory is a constituent part.

* * * * *